(12) United States Patent
Godbersen

(10) Patent No.: US 6,774,664 B2
(45) Date of Patent: Aug. 10, 2004

(54) METHOD FOR AUTOMATED MEASUREMENT OF THE OHMIC ROTOR RESISTANCE OF AN ASYNCHRONOUS MACHINE

(75) Inventor: Jens Godbersen, Sønderborg (DK)

(73) Assignee: Danfoss Drives A/S, Graasten (DK)

( * ) Notice: Subject to any disclaimer, the term of this patent is extended or adjusted under 35 U.S.C. 154(b) by 42 days.

(21) Appl. No.: 10/085,304

(22) Filed: Feb. 28, 2002

(65) Prior Publication Data

US 2002/0158658 A1 Oct. 31, 2002

Related U.S. Application Data

(63) Continuation-in-part of application No. 09/382,157, filed on Aug. 24, 1999, now abandoned.

(30) Foreign Application Priority Data

Sep. 17, 1998 (DE) .......................................... 198 42 540

(51) Int. Cl.$^7$ ............................................. G01R 31/34
(52) U.S. Cl. ..................... 324/772; 324/158.1; 324/545
(58) Field of Search ................................. 324/772, 73.1, 324/158.1, 545; 318/490, 803, 806; 702/108, 113, 57, 58

(56) References Cited

U.S. PATENT DOCUMENTS 4,441,065 A     4/1984   Bayer

| 4,670,698 A | * | 6/1987 | Fulton et al. ............... 318/802 |
| 4,672,288 A | * | 6/1987 | Abbondanti ................. 318/803 |
| 5,998,958 A | * | 12/1999 | Lee ............................ 318/801 |
| 6,199,023 B1 | * | 3/2001 | Kliman ........................ 318/490 |

FOREIGN PATENT DOCUMENTS

| DE | 3617452 | 11/1987 |
| DE | 4222304 | 1/1994 |
| EP | 0704709 | 4/1996 |

OTHER PUBLICATIONS

Godbersen, " A Practical Identification Scheme for Induction Motors at Stanstill Using Only a VS Inverter as the Actuator", EPE 1997, pp 3.370–3.374.

* cited by examiner

Primary Examiner—Vinh P. Nguyen
(74) Attorney, Agent, or Firm—Barnes & Thornburg LLP

(57) ABSTRACT

Method of automated measurement of the ohmic rotor resistance ($R_r$) of an asynchronous machine (1) controlled via an inverter (8) while being acted upon by a non-rotating field, the method involving a. measuring the ohmic stator resistance ($R_s$), the leakage inductances ($L_{os}$, $L_{or}$) and the main inductance ($L_m$) of the asynchronous machine, b. leading a testing signal ($U_{sa}$) being formed by a predetermined direct signal with a superimposed alternating signal corresponding approximately to the nominal slip frequency ($f_s$) of the asynchronous machine (1), c. measuring the amplitude and the phase ($\phi$) of the phase signal ($I_{sa}$) resulting from the testing signal, and d. calculating the ohmic rotor resistance ($R_r$) from the measured values according to a) and c).

6 Claims, 3 Drawing Sheets

METHOD FOR AUTOMATED MEASUREMENT OF THE OHMIC ROTOR RESISTANCE OF AN ASYNCHRONOUS MACHINE

RELATED APPLICATION

This application is a continuation-in-part of U.S. application Ser. No. 09/382,157, filed Aug. 24, 1999, and now abandoned.

BACKGROUND OF THE INVENTION

The invention concerns a method for automated measurement of the ohmic rotor resistance of an asynchronous machine, which is controlled via an inverter, while being acted upon by a non-rotating field.

In an asynchronous motor, whose speed and torque are controlled, particularly according to a field oriented control method, knowledge of all resistances, that is the ohmic and inductive resistances, is required to make the control as accurate as possible. They can be assessed and/or measured.

Measurements are made either with rotatable, unloaded rotor or with blocked (braked) rotor. When a testing current for measuring the resistances is led through the stator at unloaded rotor, the larger share of the current will flow through the main reactance, which is determined by the main inductance (counter-inductance), thus enabling a measurement of the main inductance, but not of the ohmic rotor resistance. When the measurement is made with blocked rotor, however, the testing current also flows through the rotor, so that also its ohmic resistance can be measured. Both methods, however, involve disadvantages.

A measurement with rotating unloaded rotor is often not possible, for example when the motor is fixedly incorporated in a finished product, and its axis is fixedly loaded. On the other hand a blocking of the motor, particularly when full torque is applied, places heavy demands on the mechanical braking device, so that this method is substantially more expensive. Another difficulty in connection with measurements on a blocked rotor is the current displacement in the rotor bars occurring at high frequencies in the range from 30 to 60 Hz, causing too high a measurement value of the ohmic rotor resistance.

Further, on measuring the ohmic resistance, its variations in dependence of the operating temperature are often not considered. Depending on the operating temperature, it can increase or decrease by 20% to 30%. This means that the equivalent diagram of the asynchronous machine forming the basis of the measurement does not apply for the normal operation.

U.S. Pat. No. 5,689,169 shows a method, in which the stator and rotor leakage inductances and the ohmic rotor resistance at stillstanding rotor are measured by controlling the q-components and the d-components in a "field oriented" control process. Thus, one phase winding of the stator receives a testing signal with a frequency, which is approximately equal to the operating frequency, and, for example, amounts to 30 Hz. The current component Iq is set at zero to avoid production of a rotating torque, and at the same time the actual voltages $V_q$ and $V_d$ fed back to the control device are measured. With known testing signal frequency and previously measured ohmic stator resistance, the approximate value of the rotor resistance can be calculated. The reason for this approximation is that the testing signal frequency is chosen to be relatively high, so that relatively simple mathematic equations can be used for the calculation, demanding only little calculation performance from a microprocessor used in the control device. However, the relatively high testing signal frequency of approximately 30 Hz has the disadvantage that a current displacement takes place in the rotor bars, which results in a too high measurement value of the ohmic rotor resistance. In extreme cases the measurement value can be 100% to 150% too high. This method, compared with a converter with an inverter having only current sensors, has the additional disadvantage that also voltage sensors must be used.

A method of estimating equivalent circuit parameter values of an induction motor is known from a paper in EPE'97 by Godbersen et al., Danfoss Drives A/S, Denmark, pages 3.370 to 3.374. According to this method a number of measurements and calculations are made and evaluated in accordance with a conventional equivalent diagram (FIG. 1 of the paper) of an asynchronous motor. That equivalent diagram is substantially as shown in FIG. 2 of the drawings of the present application. By the method presented in the paper, all the desired parameter values of the motor except the ohmic rotor resistance $R_r$ will be obtained. The paper does not describe in detail how to calculate the ohmic rotor resistance from the parameters obtained. Furthermore the applicants have found that, even though it is possible in principle to calculate the ohmic rotor resistance from the parameter values obtained with the method presented in the paper, the resistance value as actually calculated from those parameter values has too large an error.

SUMMARY OF THE INVENTION

The invention is based on the task of determining the rotor resistance of an asynchronous machine faster than hitherto, and at the same time preventing measurement faults caused by a current displacement.

The solution of this task according to the invention comprises a method for automated measurement of the ohmic rotor resistance of an asynchronous machine controlled via an inverter while being acted upon by a non-rotating field, the method involving a) measuring the ohmic stator resistance, the leakage inductances and the main inductance of the asynchronous machine, b) applying a testing signal formed by a predetermined direct signal with a superimposed alternating signal to a phase winding of the asynchronous machine, the frequency of the alternating signal corresponding approximately to the nominal slip frequency of the asynchronous machine, c) measuring the amplitude and the phase of the phase signal resulting from the test signal, and d) calculating the ohmic rotor resistance according to the measured values of a) and c).

With this solution, one measurement of the resulting phase signal in dependence of the testing signal will be sufficient. Accordingly, the measuring duration is reduced. As the frequency of the alternating signal corresponds approximately to the very low nominal slip frequency of the asynchronous machine, with which the asynchronous machine runs during operation and which results from the known frequency of the rotating field and the nominal speed of the asynchronous machine and is relatively low, also measurement inaccuracies caused by a current displacement disappear. The DC-value of the testing signal in b) above is used to bring the main inductance to a predetermined magnetizing level. The alternating signal, which is used to generate a phase displacement between the voltage of the testing signal and a measured phase current enables the calculation of the referred rotor resistance, and has a frequency which must be carefully chosen. On the one hand, if this frequency is too high, current displacement in the rotor bars will occur resulting in an erroneous value of the rotor resistance. On the other hand, choosing a frequency too low causes the current to flow through the main inductance instead of the rotor resistance.

Preferably, the ohmic rotor resistance referred to the stator side is determined first, and the actual ohmic rotor resistance is calculated by means of the measurement values according to a) and c).

Preferably, the frequency of the alternating signal is in the range from 1 to 8 Hz.

Advantageously, the direct signal is a direct voltage, which is chosen so that the resulting direct current is less than half the nominal magnetising current of the asynchronous machine. The nominal magnetising current is the current that is needed to magnetise the asynchronous machine to the level where it develops rated power.

Advantageously, the direct current amperage is chosen so that the dynamic main inductance is approximately equal to the static main inductance of the asynchronous machine.

It may be provided that the testing signal is a phase voltage, whose reference value is set on the basis of a previously measured characteristic, stored in a memory, displaying the dependency of the phase current on the reference value.

BRIEF DESCRIPTION OF THE DRAWINGS

In the following, the invention and its embodiments are explained on the basis of examples in the enclosed drawings, showing.

DESCRIPTION OF THE PREFERRED EMBODIMENTS

Figure 1:
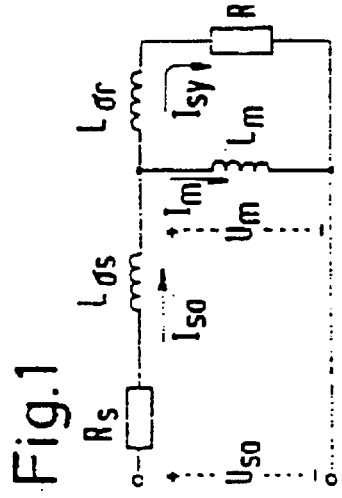
FIG. 1 a traditional, more detailed equivalent diagram of an asynchronous machine FIG. 2 a transformed equivalent diagram of an asynchronous machine at standstill with values referred to the stator side FIG. 3 a diagram with a curve showing the dependency of the static main inductance $L_m$ and the dynamic main inductance $L_{Dm}$ on the magnetising direct current of an asynchronous machine FIG. 4 the course of a phase voltage used as testing signal, comprising a direct voltage with a superimposed triangular alternating voltage FIG. 5 a block diagram of a converter controlling an asynchronous machine, whose resistances are measured automatically by means of the control device FIG. 6 a detailed block diagram of parts of the control device of the converter according to FIG. 5.
Figure 2:
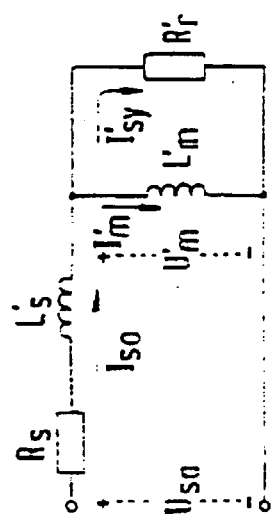

The invention is a combination of measurements and calculations made with reference to the conventional equivalent diagrams of an asynchronous motor as shown in the FIGS. 1 and 2 of the enclosed drawings, FIG. 1 showing a detailed steady-state equivalent circuit, and FIG. 2 a simplified equivalent diagram calculated (referred) to the stator side by means of the effective number of turns. By way of example, and not to be interpreted in a limiting way, the following initial steps are performed:

1. A testing voltage $U_{sa}$ in the form of a predetermined direct voltage is applied on the stator, more precisely on the phase winding of the stator, and the resulting stator current $I_{sa}$ is measured. As the inductive reactances (inductances) of the stator-side leakage inductance $L_{os}$ and the main inductance $L_m$ (counter inductance) present a short-circuit to any direct current, the ohmic stator resistance $R_s$ can then be calculated from the values $U_{sa}$ and $I_{sa}$.

2. Then the sum of the leakage inductances $L_{os}$ and $L_{or}$ referred to the stator, the "transient" inductance $L'_s$, is measured and calculated as follows, reference being made in this respect to FIG. 2: A short rectangular voltage pulse, having a high content of high-frequency components, with a duration of a few mill-seconds and an amplitude $U_{sa}$ is applied to the stator, so that the inductance of the main inductance $L'_m$ according to FIG. 2 at these high frequencies is so large that the current flowing through $L'_m$ is neglectible. Then, the rear flank of the curve of the current $I_{sa}$ produced by this impulse is sampled. The time constant $L'_s/(R_s+R'_r)$ and the differential quotient $dI_{sa}/dt$ are calculated on the basis of the sampled values. $L'_s$ is then calculated by means of the equation $U_{sa}=R_sI_{sa}+L'_s(dI_{sa}/dt)$.

3. Then a voltage is applied to the stator with such a low frequency that the current $I_{sy}$ flowing through the rotor is neglectible and the stator current $I_{sa}$ is practically equal to the magnetising current $I_m$ flowing through the main inductance. Since the ohmic stator resistance $R_s$ was determined in step (1) and the current $I_{sa}$ can be measured, the stator inductance $L_s$ ($=L_m+L_{os}$) can be determined. This determination of the stator inductance is repeated several times at different D.C. offset currents. Further, the dynamic main inductance $L'_{Dm}$ (also called differential main inductance) referred to the stator side is determined by measurement and from this the value $L_{Dm}$ can be calculated. The referred dynamic main inductance is determined as follows: a testing voltage, consisting of a direct voltage with a superimposed alternating voltage, is applied to the stator, and the resulting alternating current (in the working point determined by the direct current) is measured. This measurement is made at different premagnetising direct currents (working points).

Thus the ohmic stator resistance $R_s$, the leakage inductances $L_{os}$ and $L_{or}$, and the main inductance $L_m$ have been determined according to the process steps 1), 2) and 3) above, based on a transformation of the motor parameters, assuming an effective number of turns per phase on the rotor side, into the parameters on the stator side provided with raised comma according to FIG. 2. Now follows a detailed description of the determination of the ohmic rotor resistance $R_r$ of the asynchronous machine. Besides the three steps mentioned above, a fourth step is required for the determination of the ohmic rotor resistance $R_r$.

With reference to the transformed equivalent diagram according to FIG. 2, the following equations apply:

$$R'_r = \frac{|\overline{U'_m}|}{|\overline{I'_{sy}}|} \tag{1}$$

$R'_r$ being the ohmic rotor resistance transformed to the stator side, $U'_m$ being the voltage drop across the main inductance determined by the main inductance $L'_m$ and $I'_{sy}$ being the current flowing through the rotor. The horisontal bars across the respective values mean that complex values are concerned.

Further as is commonly known in the field of induction motor technology, the following relation applies to the ohmic resistance referred to the stator side, FIGS. 1 and 2:

$$R'_r = \frac{L_m^2}{L_r^2} \cdot \frac{R_r}{s} \tag{2}$$

In this equation $L_r$ is equal to $Lm+L_{\sigma r}$ and s stands for the slip of the asynchronous machine. As, during standstill of the asynchronous machine, the slip s is 1 and the measurements are made by using the dynamic main inductances, it can be shown by applying the rules of transformation of equivalent diagrams which are commonly known in the field of induction motor technology that:

$$R_r = R'_r \cdot \frac{L_{Dm} + L_{\sigma r}}{L'_{Dm}} \tag{3}$$

The value of the nominal rotor resistance Rr in (3) is a constant no matter what the current flowing through the stator is, but the value of the referred rotor resistance R'r is a function of the non-linear main inductance Lm, which changes its value with the DC-offset. The dynamic inductances $L_{DM}$ and $L'_{DM}$, are known from the initially described step 3), where $L'_{Dm}$ is measured with a DC-signal having an AC-signal superimposed. $L'_{Dm}$ is measured at a number of predetermined different magnetisation currents evenly distributed from zero and up to a level where the nominal magnetic flux level of the motor under test is covered.

As mentioned above, $L'_{Dm}$ was measured in step 3) and from this $L_{Dm}$ was calculated. By means of equations (4) through (7) listed below, the interrelation between $L'_{Dm}$ and $L_{Dm}$ will be further elaborated.

Figure 7:
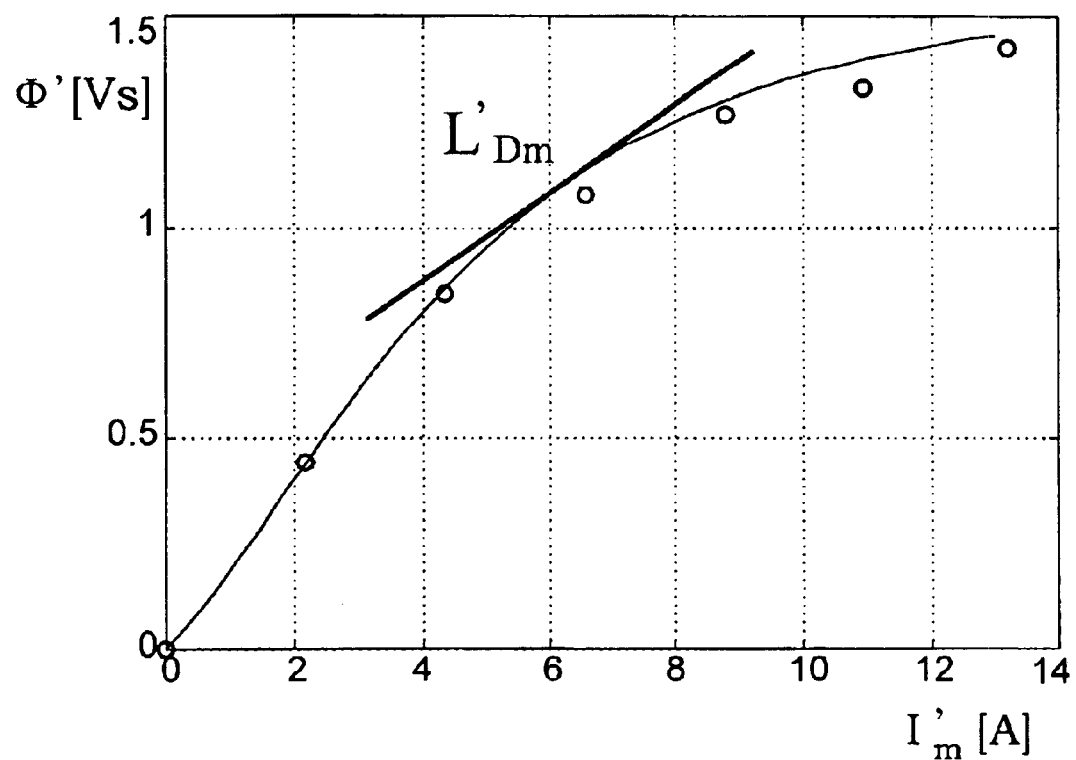
FIG. 7 a principle diagram of a magnetic flux curve as a function of the magnetising direct current of an asynchronous machine

The referred dynamic main inductance $L'_{Dm}$ being the slope of the referred magnetic flux versus the magnetizing current curve is shown in principle in FIG. 7. The referred magnetic flux is given on the ordinate, and the magnetising current, i.e. the offset current, is given on the abcissa. The magnetic flux is determined in several d.c. working points, e.g. at 2.1A and at 8.4A. The slope of the tangent in a particular d.c. working point gives the dynamic main inductance (equation (4)):

$$L'_{Dm} = \frac{d\Phi'}{dI'_m} \tag{4}$$

Where $\Phi'$ represents the magnetic flux through the referred main inductance, and $I'_m$ represents the corresponding magnetising current.

Remembering that $\Phi = L*I$ we have that $$L'_{Dm} = \frac{d(L'_m \cdot I'_m)}{dI'_m} = \frac{dL'_m}{dI'_m} \cdot I'_m + \frac{dI'_m}{dI'_m} \cdot L'_m \tag{5}$$

The last term being reduced and we have the final solution that the referred dynamic main inductance is:

$$L'_{Dm} = \frac{dL'_m}{dI'_m} \cdot I'_m + L'_m \tag{6}$$

From the relationship generally known in the field of induction motor technology, that $L'_{Dm}=L^2Dm/(L_{Dm}+L_{\sigma r})$ equation 7 can be developed and from this $L_{Dm}$ is calculated from $L'_{Dm}$:

$$L_{Dm} = \frac{L'_{Dm} + \sqrt{L'^2_{Dm} + 4 \cdot L'_{Dm} \cdot L_{\sigma r}}}{2} \tag{7}$$

Figure 4:
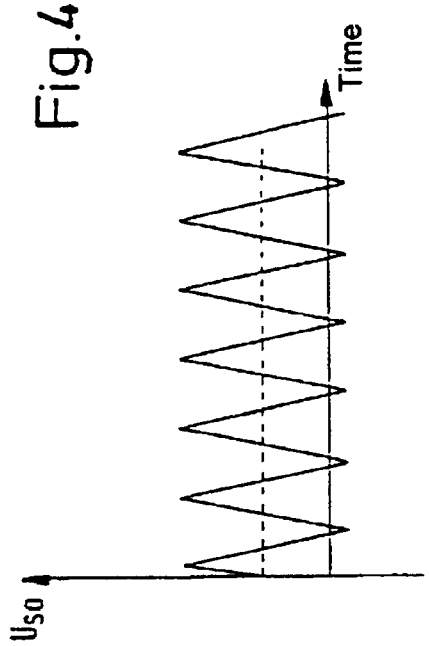

Getting back to equation (3), still not known is R'$_r$. It is assumed that $L_{\sigma r}$ is approximately equal to half the transient inductance $L'_s$. In this fourth process step a test signal in the shape of a phase voltage $U_{sa}$ consisting of a direct voltage with a superimposed, triangular alternating voltage according to FIG. 4 is applied to a phase winding of the stator, and the resulting stator current $I_{sa}$ is measured. The voltage drop $U'_m$ across the main inductance can be expressed as:

$$\bar{U}'_m = \bar{U}_{sa} - R_s \cdot \bar{I}_{sa} - j\omega \cdot L'_s \cdot \bar{I}_{sa} \tag{8}$$

For the rotor current $I'_{sy}$ referred to the stator side, it then applies that $$\bar{I}'_{sy} = \bar{I}_{sa} \cdot \cos\theta \tag{9}$$

In this equation $\theta$ is the phase displacement between $U'_m$ and $\bar{I}_{sa}$. The Arcus-tangent (Arctan) of the relation between the imaginary part and the real part of the equation (8) gives the phase displacement $\alpha$ between $\bar{U}_{sa}$ and $\bar{U}'_m$. Giving the phase displacement between $U_{sa}$ and $\bar{I}_{sa}$ the designation $\phi$, then $\theta = \alpha + \phi$. The angle $\phi$ can be determined by means of a discrete Fourier-transformation. For this purpose, the sampled values of the current $I_{sa}$ are multiplied by a complex e-function, whose exponent comprises the frequency $\omega$ of the current $\bar{I}_{sa}$ and whose oscillation is in phase with that of the testing voltage. The sampled values are numerically integrated to a complex number, and the angle $\phi$ results from the formation of the Arcus-tangent of the relation between the real and imaginary parts of this number.

Adding $\alpha$ and $\phi$ gives $\theta$ and thus, according to the equation (9), the current $I'_{sy}$. As, in the transformed equivalent diagram according to FIG. 2, $\bar{U}'_m$ and $\bar{I}'_{sy}$ are in phase, R'$_r$ results from the quotient $U'_m/I'_{sy}$.

To prevent the current displacement, a low angular frequency $\omega$ is used. However, a too low angular frequency causes the current to flow through the main inductance, not through the ohmic rotor resistance. It has turned out that a frequency in the range of the nominal slip frequency $f_s$, usually in the range from 1 to 8 Hz, meets both requirements.

Further, the testing signal voltage must be kept low with this frequency, as the impedance of the asynchronous machine during standstill is small. Non-linearities and dead times of the switching elements of the inverter mean, however, that its output current and thus also the stator current of the asynchronous machine are not proportional to the control voltage of the inverter, nor to a reference voltage of the control voltage, when the control voltage is controlled through a control device in dependence of a preset reference value. Thus, without measuring the output voltage of the inverter, respectively the phase voltage $U_{sa}$ through an additional voltage sensor, and at the same time measuring the stator current, respectively the phase current $I_{sa}$, it is not possible through a mere measurement of the current $I_{sa}$ to deduce the phase voltage $U_{sa}$. Thus, before starting the measurement of the ohmic resistances and inductances of the asynchronous machine, a characteristic of the dependence of the output voltage of the inverter or the input voltage of the asynchronous machine, respectively, on a reference value of the control voltage is determined, and the deviation (the error) from a straight characteristic, which represents the ideal case, for each stator current $I_{sa}$ is stored.

This deviation is used for the automatic correction of the reference value of the control voltage, that determines the testing signal.

Figure 3:
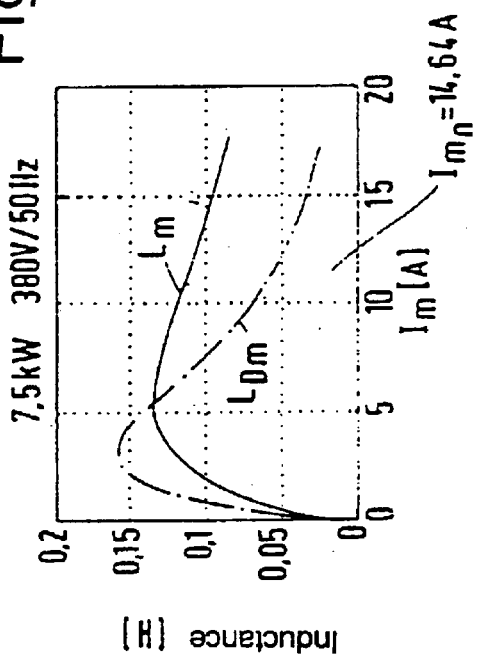

The amplitude chosen for the direct current in the stator current $I_{sa}$, determined by the testing signal $U_{sa}$, is derived from a comparison between a characteristic of the dependency of the dynamic main inductance $L_{Dm}$ on the magnetising current $I_m$ and the corresponding characteristic of the static main inductance $L_m$. These characteristics are shown in FIG. 3, the dash-and-dot line representing the dynamic main inductance $L_{Dm}$ and the full line represents the static main inductance $L_m$ as a function of the magnetising current $I_m$. The static inductance $L_m$ is defined as the gradient of a line from the origo to the working point on the magnetising curve, that is, through the relation $\Phi_m/I_m$, $\Phi_m$ [Vs] being the main flux. The dynamic inductance, also called the differential inductance, corresponds to the gradient of the magnetising curve in a predetermined point, shown in FIG. 7 and previously discussed.

In step 3) of the already mentioned measurement process, the transient dynamic inductance $L'_{Dm}$ was measured in several working points and used for calculating $L_{Dm}$. Based on these values, all other values must also be expressed as dynamic values. However, with regard to equation (3), the problem occurs that $R'_r$ must be determined through $U'_m/I'_{sy}$. According to equation (8), $U'_m$ depends on, among other things $L'_s$. However, $L'_s$ is a static inductance, and as it is not known, how this static inductance is distributed between the leakage inductances $L_{\sigma s}$ and $L_{\sigma r}$, the transient dynamic inductance $L'_{Ds}$ cannot be calculated. For a completely accurate calculation of the ohmic rotor resistance, however, the transient dynamic inducatnce $L'_{Ds}$ should be used instead of the static inductance $L'_s$. To solve this problem, the measurement is made at a direct current, at which the static main inductance $L_m$ is equal to the dynamic main inductance $L_{Dm}$. The static transient inductance $L'_s$ can, according to the common knowledge in the field of induction motor technology, be expressed as follows:

$$L'_s = L_m + L_{\sigma s} - \frac{L_m^2}{L_m + L_{\sigma r}} \quad (10)$$

and the dynamic transient inductance $L'_{Ds}$, according to the common knowledge in the field of induction motor technology, as follows:

$$L'_{Ds} = L_{Dm} + L_{\sigma s} - \frac{L_{Dm}^2}{L_{Dm} + L_{\sigma r}} \quad (11)$$

When $L_{Dm}$ and $L_m$ are equal, $L'_s$ is equal to $L'_{Ds}$. This means that with a suitable selection of the magnetising current $I_m$ according to FIG. 3, the determined value of the inductance $L'_s$ can be used as value for the dynamic inductance $L'_{Ds}$.

In FIG. 3 the dot-and-dash curve shows the dynamic main inductance $L_{Dm}$ and the full line curve shows the static main inductance $L_m$ for different direct current amplitudes in an asynchronous machine with a nominal power output of 7.5 kW, an operating voltage of 380 V and an operating frequency of 50 Hz. The curves cross in one point at approximately 40% of the nominal magnetising current $I_{m_n}$, which amounts to 14.64 A. In this point the dynamic and the static main inductances are equal. This means that the direct current of $I_{sa}$ should be set at approximately 40% of the nominal magnetising current $I_{m_n}$ for the measuring of the ohmic rotor resistance. Normally, the nominal magnetising current is determined in the following way: the user reads the motor data from the motor plate and inputs them to the frequency converter. The motor plate normally holds the nominal current, the voltage, the power and cos phi of the motor. The magnetising current, which is the current through the main inductance Lm, can be calculated from these values.

Figure 5:
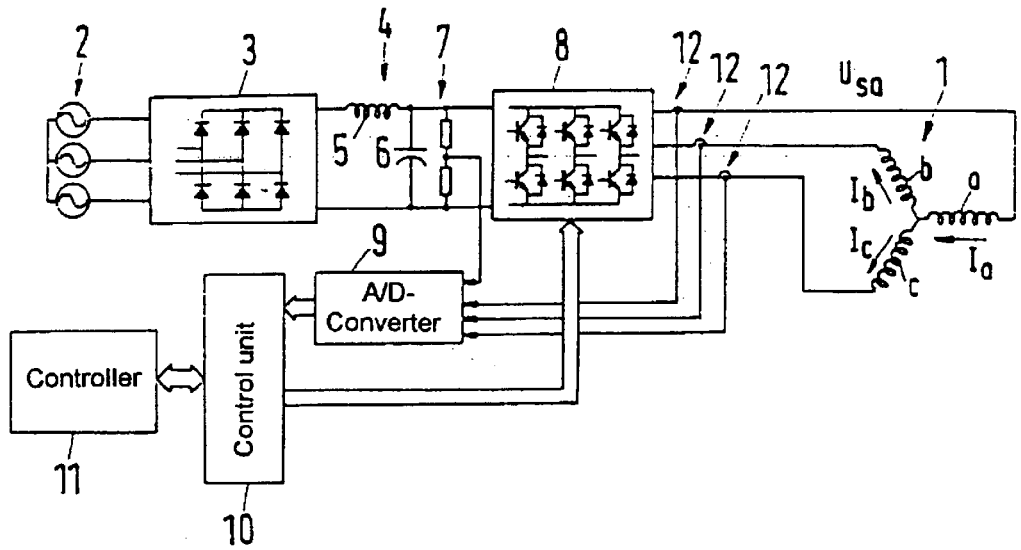
Figure 6:
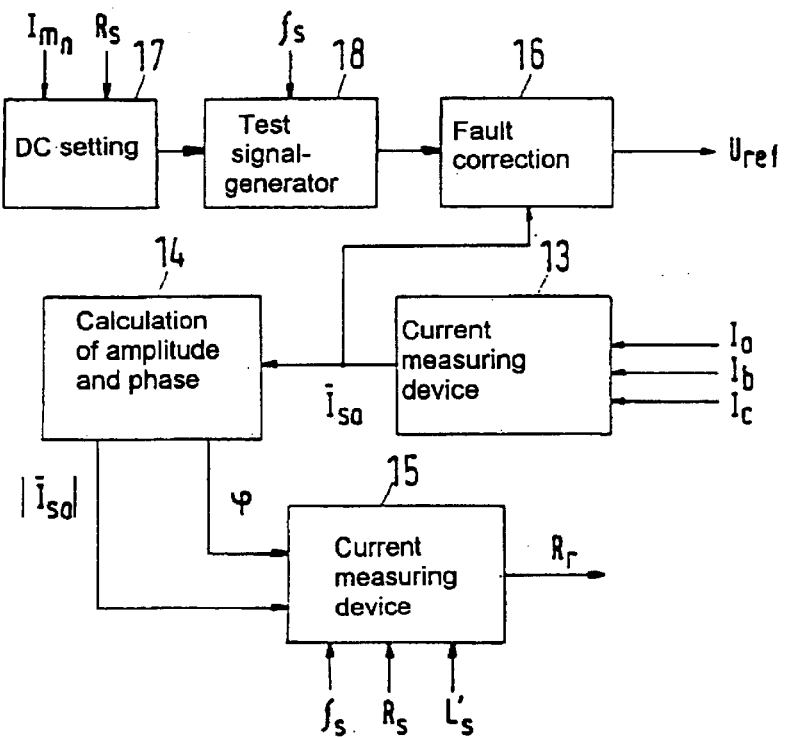

In the following, reference is made to FIGS. 5 and 6. The converter according to FIG. 5 controls the rotating speed of a three-phase asynchronous machine 1. For this purpose it comprises a bridge-rectifier 3 supplied from a three-phase current supply mains 2, and a direct current intermediary circuit 4, consisting of a throttling coil 5 and a smoothing capacitor 6. Parallel to the smoothing capacitor 6 is arranged an ohmic voltage divider 7, from which a lower voltage is tapped as measure for the direct voltage fed to a three-phase inverter 8 in bridge configuration, having transistors, each with an antiparallel connected diode, the lower voltage being led to the comparator of a controller 11 via an A/D-converter 9 and a control unit 10, the components 9, 10 and 11 forming in common a control device for the inverter 8. A current sensor 12 is connected with each of the cables of the asynchronous machine 1. Each current sensor 12 leads the measurement value of one of the phase currents $I_a$, $I_b$ and $I_c$, flowing through the phase windings a, b and c of the asynchronous machine 1 to the A/D-converter 9. Together with the control unit 10 and the current sensors 12 the A/D-converter 9 forms a current measuring device 13, shown in FIG. 6. During standstill of the asynchronous machine, while the ohmic resistances and the inductivities respectively the inductances, of the phase windings a, b and c are measured, the phase currents $I_b$ and $I_c$ have the same phase position as the current $I_a$ and only half the amplitude of the phase current $I_a$. On the basis of the three phase currents $I_a$ to $I_c$ the current measuring device 13 calculates the stator current $\bar{I}_{sa}$, which consequently, apart from a proportionality factor, corresponds to the phase current $I_a$. The stator current $\bar{I}_{sa}$ is led to a function unit 14, which, on the basis of the stator current $\bar{I}_{sa}$, calculates its amplitude and additionally also its phase displacement $\phi$ in relation to the voltage $\bar{U}_{sa}$ applied on the phase winding a as testing signal. For this purpose, the stator current $\bar{I}_{sa}$ is sampled in the function unit 14. The sampled values are multiplied by a complex e-function, whose exponent contains the frequency $\omega = 2\pi f_s$ of the current $\bar{I}_{sa}$ and whose oscillation is in phase with that of the current $\bar{I}_{sa}$, $U_{ref}$ determining this oscillation and $f_s$ being the testing or slip frequency of the asynchronous machine 1. The sampled values are numerically integrated to a complex number. The phase displacement $\phi$ is calculated through the formation of the quotient of the real and imaginary parts and the formation of the Arcus-tangent function of the quotient. The ohmic rotor resistance $R_r$ is then calculated in a function unit from the amplitude of the stator current $\bar{I}_{sa}$, the phase displacement $\phi$, the slip frequency $f_s$ and the previously determined parameters $R_s$ and $L'_s$.

To ensure in advance that the desired stator current $I_{sa}$ equal to $I_a$ is determined by the correct phase voltage forming the testing signal, independently of dead times and non-linearities of the inverter 8, which voltage is again determined by a corresponding reference voltage $U_{ref}$, which is led to the controller 11, the deviations or correction values, determined in connection with the formation of the current-voltage characteristic of the inverter 8, are stored in tabular form in a fault correcting function unit 16 in dependence of the stator current $I_{sa}$. The direct signal component (about 40% of the nominal magnetising current) is set in a function unit 17 on the basis of the nominal magnetising current $I_{m_n}$ and in dependence of the previously determined ohmic stator resistance $R_s$, and in a testing signal generator 18 the direct signal is superimposed with a triangular alternating voltage, as shown in FIG. 4, whose frequency is equal to the slip frequency f, and then corrected in the fault correction function unit 16 in dependence of the measured stator current $I_{sa}$, so that the result is the correct reference value $U_{ref}$ of the control voltage of the inverter 8, and thus also the phase voltage $U_{sa}$, corresponding to the stator current $I_{sa}$.

After determination of the correct reference value $U_{ref}$ and consequently also the phase voltage $U_{sa}$, the control unit 10 or the function unit 15 contained in the control unit 10 calculates the voltage drop $\overline{U}'_m$ according to equation (8), and, in the function unit 15, after determining the angle θ by means of the angle φ, the rotor current $\overline{I}'_{sy}$ is calculated according to the equation (9), and the ohmic rotor resistance $R'_r$ is calculated on the basis of the equations (8) and (9) according to (1), and the ohmic rotor resistance $R_r$ is calculated on the basis of the previously determined inductances according to equation (3).

The testing signal $U_{sa}$ shown in FIG. 4 is shown as a triangular signal, but can also have the shape of a square pulse or a sine wave and is applied until the resulting stator current has been stabilised, that is, until the phase displacement φ and the amplitude of the stator current $I_{sa}$ have been stabilised. The duration, during which the testing signal is applied, is about 5 seconds, however, depends on the size of the asynchronous machine.

Carrying through the measuring process according to the invention on an asynchronous machine with 7.5 kW, an operating voltage of 380 V and an operating frequency of 50 Hz gave the following values during the three initially described steps: $R_s$=0.65 Ohm, $L'_s$=8.3 mH and $L'_{Dm}$=88.7 mH. Based on this, the dynamic inductance $L_{Dm}$ was calculated to be 92.7 mH. To determine the transformed ohmic rotor resistance, the frequency of the testing signal $U_{sa}$ was set at the nominal slip frequency $f_s$=2 Hz. After the correction in the fault correction function unit 16, the testing signal $U_{sa}$ had a magnitude of 21 V. The result of the calculation of the phase displacement φ was −0.226 rad and the amplitude of the stator current $I_{sa}$=20.4 A. For $R'_r$, this resulted in a value of 0.39 Ohm, and according to equation (3) for $R_r$ a value of 0.44 Ohm. Compared with the correct value of the ohmic rotor resistance of 0.45 Ohm, the fault was approximately 2.3%, which is a typical value with this method, and which is sufficiently accurate for an inverter with field oriented control, as in the present case.

The ohmic rotor resistance $R_{T1}$ determined at a predetermined temperature $T_1$ can be recalculated to an ohmic rotor resistance $R_{T2}$ at a different temperature $T_2$ by means of the equation (12).

$$R_{T_2} = R_{T_1} \cdot \frac{T_2 + K_T}{T_1 + K_T} \quad (12)$$

In this equation $K_T$ is a material constant (with copper, for example, $K_T$=235, when the operating temperatures $T_1$ and $T_2$ are measured in ° C.).

The equation (12), however, assumes that the second temperature $T_2$ is known, which is not always the case. By means of the method according to the invention, however, the ohmic rotor resistance can be determined during a short standstill of the asynchronous machine, without knowledge of the temperature.

List of the physical units

| | |
|---|---|
| $U_{sa}$ | Testing signal, phase voltage, stator voltage |
| $I_{sa}$ | Phase current, stator current, phase signal |
| $I_a, I_b, I_c$ | Phase currents in the stator |
| $U_m$ | Voltage across main inductance |
| $I_m$ | Magnetising current |
| $I_{m_n}$ | Nominal magnetising current |
| $I_{sy}$ | Rotor current |
| $R_s$ | Ohmic stator resistance |
| $R_r$ | Ohmic rotor resistance |
| $U_{ref}$ | Reference voltage |
| $L_m$ | Static main inductance |
| $L_{Dm}$ | Dynamic main inductance |
| $L_s$ | Stator inductance ($L_m + L_{σs}$) |
| $L_{σs}$ | Stator leakage inductance |
| $L_{σr}$ | Rotor leakage inductance |
| $L'_m$ | Referred main inductance |
| $L'_{Dm}$ | Referred dynamic main inductance |
| $L'_{Ds}$ | Referred dynamic transient inductance |
| $L'_s$ | Referred transient inductance ($L_{σr} + L_{σd}$) |
| $U'_m$ | Voltage drop across the referred main inductance |
| $I'_m$ | Current through the referred main inductance |
| $I'_{sy}$ | Referred rotor current |
| $R'_r$ | Referred rotor resistance |
| Θ | Phase displacement between $\overline{U}'_m$ and $\overline{I}_{sa}$ |
| α | Phase displacement between hen $\overline{U}_{sa}$ and $\overline{U}'_m$ |
| φ | Phase displacement between $\overline{U}_{sa}$ and $\overline{I}_{sa}$ |
| ω | Angular frequency $2\pi f_s$ |
| $f_s$ | Testing or nominal slip frequency, respectively |
| s | Slip |
| $\Phi_m$ | Main flux |
| $T_1, T_2$ | Operating temperatures of the asynchronous machine |
| $R_{T_1}, R_{T_2}$ | Ohmic resistances at different operating temperatures |
| $K_T$ | Material constant of the conductor material of the rotor |

What is claimed is:

1. Method for automated measurement of the ohmic rotor resistance ($R_r$) of an asynchronous machine controlled via an inverter while being acted upon by a non-rotating field, the method comprising
    a. measuring the ohmic stator resistance ($R_s$), the leakage inductances ($L_{σs}$, $L_{σr}$) and the main inductance ($L_m$) of the asynchronous machine,
    b. applying a testing signal ($U_{sa}$) consisting of a predetermined direct signal with a superimposed alternating signal to a phase winding (a) of the asynchronous machine, the frequency of the alternating signal corresponding approximately to a nominal slip frequency ($f_s$) of the asynchronous machine,
    c. measuring the amplitude and the phase (φ) of the phase signal($\overline{I}_{sa}$) resulting from the testing signal, and
    d. calculating the ohmic rotor resistance ($R_r$) from the measured values according to steps a) and c).

2. Method according to claim 1, in which an ohmic rotor resistance ($R'_r$) transformed to the stator side is determined first, and the actual ohmic rotor resistance ($R_r$) is calculated by means of the measured values according to steps a) and c).

3. Method according to claim 1 in which the frequency ($f_s$) of the alternating signal is in the range from 1 to 8 Hz.

4. Method according to claim 1 in which the direct signal is a direct voltage which generates a direct current having an amplitude of less than half a nominal magnetising current ($I_{mn}$) of the asynchronous machine.

5. Method according to claim 4, in which the direct current is such that the dynamic main inductance ($L_{Dm}$) is approximately equal to the static main inductance ($L_m$) of the asynchronous machine, whereby the dynamic main inductance can be expressed by the equation $$L_{Dm} = \frac{dL_m}{dI_m} \cdot I_m + L_m$$

In which $L_{Dm}$ is the dynamic main inductance, $L_m$ the static main inductance and $I_m$ the magnetising current.

6. Method according to claim 1 in which the testing signal is a phase voltage ($U_{sa}$) having a reference ($U_{ref}$) set on the basis of a previously measured characteristic, stored in a memory, the characteristic describing the relation between the phase current ($I_{sa}$) and the reference.

* * * * *